United States Patent [19]

Sarazin et al.

[11] 3,984,598

[45] Oct. 5, 1976

[54] METAL-CLAD LAMINATES

[75] Inventors: Richard G. Sarazin, Onalaska, Wis.; Alan D. Wilks, Mount Prospect, Ill.

[73] Assignee: Universal Oil Products Company, Des Plaines, Ill.

[22] Filed: Feb. 8, 1974

[21] Appl. No.: 440,915

[52] U.S. Cl. ............................... 428/336; 156/150; 156/151; 156/233; 156/246; 156/272; 204/35 R; 428/209; 428/210; 428/418; 428/457; 428/901

[51] Int. Cl.² ...................... C25D 5/56; C25D 5/00

[58] Field of Search ............... 161/DIG. 7, 406, 165, 161/213, 186; 156/150, 151, 233, 246, 249, 272; 29/196.3, 195 P; 428/418, 457, 901, 202, 209, 210, 336; 204/15, 17, 20, 23, 35 R

[56] References Cited
UNITED STATES PATENTS

| | | | |
|---|---|---|---|
| 2,666,008 | 1/1954 | Enslein | 161/406 |
| 2,874,085 | 2/1959 | Brietzke | 161/DIG. 7 |
| 3,088,847 | 5/1963 | Pines | 161/DIG. 7 |
| 3,220,897 | 11/1965 | Conley | 161/186 |
| 3,235,395 | 2/1966 | Scharf | 156/249 |
| 3,324,014 | 6/1967 | Modjeska | 156/150 |
| 3,340,121 | 9/1967 | Lawrenz | 156/233 |
| 3,393,117 | 7/1968 | Zolg | 161/186 |
| 3,434,889 | 3/1969 | Haroldson | 161/213 |
| 3,506,507 | 4/1970 | Brietzke | 161/406 |
| 3,532,587 | 10/1970 | Ungar | 156/150 |
| 3,644,166 | 2/1972 | Gause | 161/213 |
| 3,741,858 | 6/1973 | Fujiwara | 161/185 |
| 3,753,850 | 8/1973 | Brunet | 156/233 |

Primary Examiner—Harold Ansher
Assistant Examiner—Ellis P. Robinson
Attorney, Agent, or Firm—James R. Hoatson, Jr.; Raymond H. Nelson; William H. Page, II

[57] ABSTRACT

Metal-clad laminates in which the metal coating of the laminate is only from about 1 micron to about 20 microns in thickness are prepared by depositing a copper coating on a substrate which has been treated with a release agent, treating the upper side of the metal layer to improve the adhesive properties of the metal, thereafter bonding the metal coating to a laminate and removing the substrate to thus prepare the desired metal-clad laminate.

24 Claims, No Drawings

METAL-CLAD LAMINATES

BACKGROUND OF THE INVENTION

Metal-clad laminates which are used in various electrical apparatus have been formed by various means in the prior art. For example, one method of preparing a copper-clad laminate is to press a resin bonded to a filler with a metal component, a thin film of thermoplastic polymeric material being deposited between the resin and the metal component. Another prior art method is to utilize various laminates such as glass, fiber, paper, phenolic resins, etc. to which a metal layer may be deposited thereon, the surface of the laminate being treated in various ways before bonding the metal thereto. Yet another method of preparing metal-clad laminates is to apply a plurality of resins to a sheet of fibrous material to produce a smooth surfaced sheet member and thereafter applying a resinous adhesive coating to the smooth surface followed by heat treating and application of a metal foil followed by pressing to produce the desired metal-clad laminate. However, in these prior art metal-clad laminates, the metal foil which is utilized as the coating or conductive layer is relatively thick due to the inability of the present methods of operation to handle a relatively thin foil. Currently, the limiting factor in utilizing thinner foils is the inability to handle any metal foil such as copper which is thinner than one-half ounce per square foot by manual or mechanical means. However, as will be hereinafter set forth in greater detail, it has now been discovered that relatively thin metal coatings having a thickness of from about 1 micron to about 20 microns may be utilized as a conductor for a laminate.

In addition, it is also known that a thin film of conductive metal may be applied to a carrier metal which is temporary in nature, the temporary carrier being of such material so that it can be thrown away after one use. The thickness of this temporary carrier will depend upon the stiffness of the material which is used. After preparing the conductive metal film on the temporary carrier, it is then bonded to a laminate following which the clad laminate will then undergo a number of manufacturing operations which are involved in printed circuitry, said operations including drilling, punching, etching, etc. However, before the printed circuit board can be processed further the temporary carrier must be removed by chemical or mechanical means and, due to the fact that it is still present when the various operational steps are performed and is not reusable when the temporary carrier is removed by physical means, it is necessary that the adhesion between the temporary carrier and the conductive metal be kept within certain limits which will insure the possibility of an easy removal of the carrier after the conductive metal has been bonded to the laminate. However, certain factors are present in the lamination process which can give rise to a metal-clad laminate in which it is difficult to remove the temporary carrier from the face of the conductive metal. One such factor which is involved in the removal could be when the resin is removed from beneath the conductive metal coating and the glass fiber weave of the laminate forces it into the temporary carrier. This can happen when the high spots in the glass fiber mat cause relatively large localized pressures which tend, at the elevated temperatures necessary for lamination, to weld the conductive metal such as copper to the temporary metallic carrier such as aluminum. This welding will then cause some difficulty in stripping the temporary carrier from the finished laminate. It then becomes necessary that a minimum dwell time is required in order to obtain laminates which will permit the ready stripping of the temporary carrier from the bonded laminate. The dwell time may be defined as the time during which the resin is in a liquid or semiliquid phase and is free to move against the mat. The longer the time period exists that the resin is in a fluid state, the more the resin will flow to the edge of the pack in order to remove or relieve the pressure and therefore the more resin that is removed from between the mat and the conductive metal, the greater will be the difficulty in removing the temporary carrier. In commercial operations, it is extremely difficult to achieve a relatively short dwell time in a laminating operation. In addition, another difficulty is present when a double-clad laminate is to be prepared inasmuch as in most pre-preg materials containing a low percentage of resins there is a disparity between the amount of the resins between the two surfaces of the material. In many instances there is a rough side and a smooth side of the pre-preg, the rough side tending to be deficient in resin and the smooth side having a surplus thereof. Therefore for the reasons hereinbefore set forth a situation may exist in the case of doublesided laminates where one side will be easily stripped from the supporting carrier while the other side will be difficult to strip of the supporting material. These difficulties can be overcome be preparing a metal-clad laminate using the process of the present invention which will be hereinafter described in greater detail.

This invention relates to metal coated laminates and to a method for the preparation thereof. More specifically, the present invention is concerned with metal coated laminates in which the metal coating has a thickness of from about 1 to about 20 microns, and to a novel method for the preparation of the same.

Metal-clad laminates, and particularly copper-clad laminates, are widely used in the electrical industry in the preparation of printed electric circuit boards. In these electric circuit boards the copper or other metal which is deposited on the surface of the laminate must be bonded to the laminate so that subsequent handling and usage thereof will not affect the electrical properties of the board. In addition to the necessary bonding or adhesion of the metal to the laminate, it is also preferred that the printed circuit boards be prepared comprising metal-clad laminates in which the metal is as thin as possible. By utilizing a reltively thin layer of metal such as copper, i.e., a layer which is from about 1 to about 20 microns in thickness, it will be possible to greatly reduce the etching time with a concomitant advantage of using less of the etching solutions as well as smaller amount of spent etchant which need to be disposed as well as a reduced rejection rate due to copper surface defects. In addition, less undercutting will occur along with a finer line definition with finer or narrower circuit lines and closer spacing allowing greater circuit density. An added advantage to the use of a thin layer will be that there is a lesser problem with the availability of hard-to-obtain thick copper foil.

A current problem in the use of thinner foils is the inability to handle anything which is thinner than one-half ounce per square foot by manual or mechanical means. However, by utilizing the process of the present invention, it will be possible to prepare a metal-clad laminate in which the metal is bonded to the laminate wherein the metal layer will have a thickness ranging from about 1 to about 20 microns. The circuit boards which are prepared according to the process of this invention will, as hereinbefore set forth, be used in the electrical and electronics industries in radios, televisions, computers, etc.

It it therefore an object of this invention to provide a metal-clad laminate in which the metal is in the form of a relatively thin coating on the laminate.

A further object of this invention is found in a process for producing a metal-clad laminate in which the metal on the laminate is in the form of a relatively thin coating, the thickness of said coating being from about 1 to about 20 microns.

In one aspect an embodiment of this invention resides in a metal-clad laminate in which the metal has a thickness of from about 1 to about 20 microns prepared by depositing a layer of conductive metal on the surface of a substrate which has been treated with a release agent, treating the upper side of said conductive metal to improve the adhesive properties thereof, bonding said conductive metal to a laminate and removing said substrate.

Another embodiment of this invention is found in a method for preparing a metal-clad laminate which comprises treating a substrate with a release agent, depositing a layer of conductive metal on the surface of said substrate, treating the upper side of said conductive metal to improve the adhesive properties thereof, bonding said conductive metal to a laminate, removing said substrate, and recovering the resultant metal-clad laminate.

A specific embodiment of this invention resides in a metal-clad laminate in which the metal such as copper possesses a thickness of from 1 to about 20 microns, said laminate having been prepared by depositing a layer of copper on the surface of a substrate such a stainless steel which has been treated with a silane release agent, thereafter treating the upper side of said copper to improve the adhesive properties thereof, bonding said copper to a laminate comprising a glass epoxy resin, and removing said stainless steel.

Another specific embodiment of this invention is found in a method for preparing a metal-clad laminate which comprises treating a stainless steel plate with a silane release agent, depositing a layer of copper on the surface of stainless steel, treating the upper side of said copper by subjecting said copper to a high current density, oxidizing the surface by the addition of heat, thereafter treating the oxidized surface with a silane bonding agent, bonding said copper to a glass epoxy resin laminate, removing the stainless steel and recovering the resultant copper-clad glass epoxy resin laminate.

Other objects and embodiments will be found in the following further detailed description of the present invention.

The metal coated laminate of the present invention is prepared by forming a thin coat of copper or other desired conductive metals such as nickel, tin, gold, etc. on the treated surface of a predetermined substrate. This substrate may be metallic or non-metallic in nature, said substrate comprising steel, aluminum, or other metals or, if so desired, it may be non-metallic in composition such as plastics, including polyethylene, polypropylene, epoxy resin, etc. The substrate is treated with a material which will insure the formation of a relatively poor bond between the substrate and the electro- or electrolessly deposited metal coating. This treatment will consist in applying a release agent to the surface of the substrate. The release agent which may also be characterized as a parting agent, slip agent, etc. will comprise a film which will prevent or reduce the adhesion between the surface of the metal coating and the substrate. Suitable release agents which may be utilized will include calcium fluoride, alkoxy silanes, polysiloxanes, silica colloids, etc. One method of applying the release agent to the surface of the substrate is from a water solution which is followed by other steps to insure the removal of excess release agent from the surface of the substrate, the removal of the excess being accomplished by washing or wiping the surface of the substrate. Following this, the coating of the conductive metal such as copper or the like is then accomplished by electroplating at appropriate conditions whereby the full and relatively uniform coverage of the substrate with the desired thickness of metal is insured. For example, one method of obtaining a uniform relatively thin copper coating on the substrate is to utilize a copper pyrophosphate plating bath which contains copper pyrophosphate as well as nitrates, ammonia and orthophosphates. The weight ratio of pyrophosphate ion to copper ion should be maintained in a range of from about 7.0:1 to about 8.0:1. The plating is effected at a pH usually in the range of from about 8.1 to about 8.8 at an elevated temperature of from about 120° to about 140° F. The electric current necessary to effect the electrolytic deposition of copper on the substrate will include a voltage of from 1.4 to about 4.0 volts, a cathode current density of from about 10 to about 80 amps per square foot and an anode current density of from about 20 to about 40 amps per square foot. Likewise when utilizing a copper sulfate plating bath in the presence of sulfuric acid and any addition agents which may be required at operating conditions of the bath will include a temperature in the range of from about 65° to 125° F., a cathode current density of from about 20 to about 50 amps per square foot and an anode current density of from about 15 to about 45 amps per square foot. The plating of the copper from either the copper pyrophosphate or copper sulfate bath is accomplished during an agitation of the bath by means of an air or, in the preferred embodiment, a nitrogen current flowing into said bath. In addition, it is also contemplated within the scope of this invention that various material or additives may be present in the copper sulfate bath to improve the deposit of copper on the substrate. Other baths which may be utilized to effect an electrolytic plating of the conductive metal on the substrate will include acid copper fluoroborate, alkaline gold cyanine, acid gold, tin-nickel, nickel sulfamate, rhodium sulfate, silver cyanine, etc. As in the case of the various copper plating baths hereinbefore set forth, it is to be understood that the typical composition and operating conditions of the various conductive metal baths will vary as to pH, temperature, voltage, as well as cathode and anode current densities, these variables being well known in the plating art. It is to be understood that the aforementioned metals are only representative of the class of metals which may be utilized for the conductive metal portion of the metal-clad laminate and that the present invention is not ncessarily limited thereto. While, as hereinbefore set forth, a specific example of a copper electroplating system has been set forth, it is to be understood that each plating operation must be operated and maintained in order to obtain the desired relatively thin metal coating which constitutes the metal portion of the metal-clad laminate, the specific characteristics of each metal coating being independent of a different metal coating.

It is also contemplated within the scope of this invention that the metal of the type hereinbefore set forth may also be deposited on the substrate in an electroless manner. This type of plating may be accomplished by immersing the substrate which has been pretreated and which may, in this instance, comprise a non-metallic substrate in a bath comprising stannous chloride. The substrate is then removed, washed with water and dipped in a solution of slightly acidic palladium chloride. Following this, the substrate is then dipped in an electroless bath such as, for example, copper sulfate-formaldehyde which may contain other additives. If so desired, the substrate may be first dipped in a bath comprising a mixture of stannous chloride and palladium chloride, there being a colloidal suspension of the palladium metal in the bath followed by washing and immersion in a bath of the metal which is to be plated on the substrate.

When the metal coating on the treated substrate has reached the desired thickness, that is, being from about 1 to about 20 microns in thickness, the plating step is terminated and the upper surface of the metal coating is then treated in order to provide a surface which will possess increased adhesive properties thereof. The first step of treating the upper surface of the conductive metal foil comprises subjecting said metal to a high current density with no agitation or stirring of the plating solution This high current density comprises increasing the amperage of the bath from about 18 amps per square foot up to about 105 or more amps per square foot. The result of this increased or high current density in the absence of agitation or stirring will result in a normally undesirable condition in which the upper surface is slightly roughened, said roughening resulting in a greater surface area for bonding the exposed surface of the metal to the laminate in a subsequent step. Upon completion of the step of subjecting the metal coating to a high current density treatment, the exposed roughened surface of the metal is subjected to the action of an oxidizing agent such as heat, oxygen, hydrogen peroxide, etc., this step resulting in the preparation of surface which is capable of interacting with a bonding agent such as those containing an aliphatic amine group of a type hereinafter set forth in greater detail which is capable of being incorporated into the curing laminate.

Following the oxidation of the upper surface of the metal coating, the surface is then treated with a bonding agent. Although it is contemplated within the scope of this invention that any type of bonding agent known in the art may be used which acts as an interface between the surface of the metal and the laminate by forming a resin bond, the preferred bonding agent comprises a silane, a particularly applicable silane being a gamma-aminopropyltriethoxysilane. The thus treated metal coating containing the bonding agent thereon in a relatively thin film is then bonded to a laminate of a type hereinafter set forth in greater detail by conventional bonding methods such as heat and pressure, the bonding step being performed at an elevated temperature in the range of from about 250° to about 500° F. or more and at a pressure ranging from about 200 to about 1000 pounds per square inch or more. The time during which the metal coating is being bonded to the laminate may vary over a relatively wide range of from about 0.5 up to about 2 hours or more, the bonding time being dependent upon the other parameters of the step such as temperature, pressure and resin composition. The treatment of the upper surface of the metal utilizing a high current density, an oxidation, followed by a thin film of bonding agent, the bonding agent being preferably present in a thickness of 1 molecule, differs from the prior art which teaches that relatively thick coats of bonding agents are utilized to improve the adhesion. Furthermore, the oxidation of the surface also differs from the prior art which teaches deoxygenation of the surface followed by polymerization of the bonding agent such as the silane on the surface of the metal in a thick film.

Examples of laminates which may be used as the base for the conductive metal on one or both sides thereof preferably consist of thermosetting resins. The thermosetting resins are preferably impregnated on a base material which may, in the preferred embodiment of the present invention include paper which imparts a good mechanical strength combined with low cost, glass fiber which is used in either low pressure or high pressure laminates, especially where electrical properties are important, as well as low moisture absorption, high tensile, flexural and comprehensive strengths are required, fabrics, lignin, asbestos, or synthetic fibers such as Rayon, Nylon, etc. The aforementioned base material is impregnated with the thermosetting resins such as phenolic resins, melamine resins, epoxy resins, silicones, polyimides, acrylic resins, polyesters, etc. It is to be understood that the aforementioned base materials and thermosetting resins are only representative of the class of laminates which may be used, and are given only for purposes of illustration rather than for restricting the present invention.

The preparation of the metal-clad laminate in the final step is accomplished by heat pressing the metal coated substrate, the upper surface of which having been treated in a manner hereinbefore set forth, with the laminate at a temperature and pressure within the range hereinbefore set forth. Upon completion of the desired residence time at the temperature and pressure previously selected, the metal-clad laminate in which the metal is on one or both sides thereof is removed from the press and the substrate is thereafter removed from the metal, the removal of the substrate being facilitated by the presence of the release agent on the surface of the substrate. The substrate which still contains the release agent in a thin film thereon is then ready for repeated plating and pressing cycles, it being not necessary to refinish the substrate after every cycle.

As will hereinafter be shown in the following examples by utilizing the process of the present invention a metal-clad laminate will be formed which will possess many desirable physical characteristics such as a relatively thin metal coating of from about 1 to about 20 microns in thickness, said coating possessing peel strengths sufficient to meet the requirements placed upon the completed printed circuits, a feat not easily achieved without the use of other processes currently utilized on commercial foils used in laminate cladding. These examples will show the effect which is obtained by utilizing the steps of preparing the conductive metal subsequent to plating on a substrate and prior to being bonded to the desired laminate, namely, subjecting the conductive metal coating to a high current density without agitation followed by oxidation and treatment with a bonding agent.

The following examples are given to illustrate the metal-clad laminates which may be prepared according to the invention and the process for preparing the same. However, these examples are given merely for purposes of illustration and are not intended to unduly limit the same.

EXAMPLE I

A stainless steel caul plate which was normally used in the forming of high pressure laminates was treated with a silane known in the trade as A-151 sold by Union Carbide Company. The treatment was effected by applying the silane as a water solution which had been buffered to a pH of about 2 followed by washing the surface to effect the removal of excess silane therefrom. Following this, the steel plate was copper plated by immersion in a copper sulfate-sulfuric acid bath, the bath containing 1980 grams of copper sulfate, 900 grams of sulfuric acid and 12 liters of water. The plating was effected at room temperature and a current of 18 amps per square foot, the bath being stirred by nitrogen bubbling while the anodes were separated by filter paper supported by Plexiglass plates which were drilled so as to be provided with 1 inch diameter holes. When the desired thickness of copper had been plated on the stainless steel plate, stirring was discontinued by halting the nitrogen input and increasing the current density by raising the charge to 5 volts for a period of 15 seconds. Further treatment of the copper plate comprised placing the copper plated steel caul plate in an oven at a temperature of from 200° to 300° F. for a period ranging from about several minutes to several hours, ideally until a noticeable, but firmly adherent, oxide coating was formed on the exposed surface of the metal film. An alternative method of oxidizing the exposed surface of the copper was to subject the aforesaid copper plated steel plate to the action of hydrogen peroxide, said hydrogen peroxide being added in a strength of 1% to 30% concentration of hydrogen peroxide for a period of time such that a noticeable oxide film was observed on the metal surface, the duration of the hydrogen peroxide treatment being dependent upon the strength of the solution.

The final step in treating the exposed surface of the copper was to add a bonding agent, said bonding agent comprising a silane known as A-1100 and sold by Union Carbide Company. This silane comprised, as hereinbefore set forth, a gamma-aminopropyltriethoxysilane. The laminate was then prepared for pressing by laying up suitable prepregs with the metal-clad caul plate and pressing the composite for a period of 1 hour at a pressure of 1000 pounds per square inch while maintaining the temperature of the pressure apparatus in a range of from about 340° to 350° F.

The metal-clad laminate was then separated from the caul plate by removal of the flow (the excess resin which was squeezed from the prepregs by the pressure applied during curing) and the copper which coated the edges of the caul plate was removed by grinding or cutting the material and removing the caul plate from the laminate. The thickness of the copper coating on the laminate was measured with a micrometer and was found to be in a range of from about 5 to about 12 microns. Other samples were then prepared in a similar manner with the exception that the thickness of the copper coating was allowed to reach a range of from about 15 to about 45 microns for use in a peel value test.

In addition other metal-clad laminates were also prepared for use in a peel value test, however, certain of the steps of the present process were omitted during the preparation thereof. For example, the high current density step was omitted with some laminates, in other laminates the oxidation step was omitted while in a third series of laminates the treatment with the bonding agent was omitted. The results of these tests are set forth in Table I below.

TABLE I

| Laminate | High Current Density Treatment | Oxidation Treatment | Bonding Agent | Peel Value lbs/inch |
|---|---|---|---|---|
| A | 5 volts for 15 sec. | — | — | 4.82 |
| B | — | Yes | — | 5.35 |
| C | — | — | Silane | 1.50 |
| D | — | Yes | Silane | 3.69 |
| E | — | — | Silane | 1.90 |
| F | — | Yes | Silane | 2.85 |
| G | — | — | Silane | 4.49 |
| H | 5 volts for 15 sec. | Yes | Silane | 8.62 |
| I | 5 volts for 15 sec. | Yes | Silane | 8.00 |

From the above table which discloses the peel value of a copper strip which had an average width normallized to 1 inch and an average thickness of about 1.5 mls, it is evident that the copper which was subjected to the three individual steps of the present process, namely, high current density, oxidation and the addition of a bonding agent possessed peel values which were greatly in excess over the peel value of those strips which were not subjected to all of the various steps of the process. When more severe treatments such as subjecting the coated substrate to a high current density of 105 amps per square foot for a longer period of time, it is possible to attain a peel value of 14 pounds per inch.

EXAMPLE II

In like manner a thin coating of gold is plated on a steel caul plate by treating said caul plate with a release agent comprising a silane comprising a vinyl silane. The plating is accomplished by placing said caul plate in an acid gold bath at a pH in the range of from about 3.5 to 4.5 while maintaining the temperature of the bath in a range of from about 80° to 120° F. utilizing a voltage of about 2 volts and a cathode current density of about 10 amps per square foot. Upon reaching the desired thickness of gold on the steel caul plate, that is, a thickness of from 1 to about 20 microns, agitation is discontinued and the voltage is raised to provide a high current density treatment. Following this the exposed surface of the gold coating is subjected to an oxidation treatment by heating in an oven or under a flame at a temperature of about 900° F. Alternatively the oxidation may be accomplished by an anodic oxidation in a suitable electrolyte. Following this a bonding agent comprising a silane similar in nature to that set forth in Example I above is placed on the surface of the gold and the thus treated gold coating is pressed to a laminate comprising a glass epoxy resin which is in a B stage prepreg condition. The composite is subjected to a pressure of 1000 pounds per square inch at a temperature of about 350° F. until the desired stage of curing is realized. Following this the laminate is then separated from the caul plate, etched and recovered. Other gold coated laminates are prepared according to the above process with the exception of a thicker coat of gold and subjected to a peel value test. It will be determined that the peel value of the gold coating which has been prepared according to the above process will be greater than that of gold coating which has been pressed on a glass epoxy resin in a process whereby one or more of the above steps in the preparation have been omitted.

EXAMPLE III

In like manner a nickel coating having a thickness of from 1 to 20 microns is plated on a steel caul plate which has been treated with a release agent comprising a vinyl silane. Upon reaching the desired thickness plating is discontinued, the agitation of the plating bath is also discontinued and the voltage is increased so that the exposed surface of the nickel is treated with a high current density. Following this, the nickel plated caul plate is removed from the bath, washed and treated with hydrogen peroxide in the oxidation or second step of the process. Thereafter a bonding agent is coated on the exposed surface of the nickel and the nickel coating is laminated to a glass polyimide resin, the pressing of the nickel coating to the laminated being accomplished in a manner similar to that set forth in Example I above. When the pressing is completed, the caul plate is removed from the metal-clad laminate. Other laminates are prepared according to the above process possessing a slightly thicker nickel coating, these laminates then being etched and the nickel coated on the laminate is subjected to a peel value test. It will be determined that the peel value of the nickel coating on the laminate which was prepared according to the above process is greater than the peel value which is possessed by a nickel coating pressed on a laminate which has not undergone the treatment comprising the steps of high current density, oxidation, and the placing of a bonding agent thereon.

EXAMPLE IV

In this example a tin coating is plated on a steel caul plate in a manner similar to that set forth in Example I above. The caul plate comprises a stainless steel plate which has been pretreated with a release agent such as a vinyl silane. The release agent will act as a point of fracture. By utilizing the vinyl silane, the formation of the release agent on both surfaces is prevented and the fracture which will occur later in the process between the conductive metal and the stainless steel will occur between said metal and the silane release agent. Upon completion of the plating operation in which the tin coating will reach a thickness of from 1 to 20 microns the plating step is terminated, agitation is discontinued, and the voltage is increased so that the exposed surface of the tin is treated with a high current density. Thereafter the tin coated steel caul plate is removed and oxidized in an oven or by treatment with a hydrogen peroxide solution in a manner similar to that hereinbefore set forth in Example I. Thereafter a bonding agent comprising a gamma-aminopropyltriethoxysilane is placed on the exposed surface and the tin coating is bonded to a paper phenolic resin which is in a prepreg state. The bonding is accomplished by pressing at a pressure of about 1000 pounds per square inch and an elevated temperature of about 350° F. for a period of time sufficient to realize the desired stage of cure. When this stage of cure is reached, pressure and heat are removed and the caul plate is separated from the tin-clad paper phenolic resin laminate. Other tin coated laminates possessing a thicker coating of from about 15 to about 50 microns are prepared according to the present process, etched and the strips are subjected to a peel value test, said peel value test disclosing the fact that these strips will possess a peel value greatly in excess over those strips which have not undergone the aforementioned three stages of treatment prior to bonding to the laminate.

We claim as our invention:

1. A method for preparing a metal-clad laminate which comprises applying a release agent to a surface of a substrate, plating said surface with a conductive metal to a thickness of from 1 to about 20 microns, thereafter subjecting the resultant conductive metal layer to a high current density to roughen the exposed surface of the metal, then oxidizing said surface, thereafter contacting said surface with a bonding agent, bonding the thus treated conductive metal to a laminate, removing said substrate, and recovering the resultant metal-clad laminate.

2. The method as set forth in claim 1 in which said substrate is metallic in nature and said conductive metal is electrolytically deposited thereon.

3. The method as set forth in claim 1 in which said substrate is non-metallic in nature and said conductive metal is electrolessly deposited thereon.

4. The method as set forth in claim 1 in which said bonding of said conductive metal to said laminate is effected by applying heat and pressure to said laminate.

5. The method as set forth in claim 1 in which said conductive metal is copper.

6. The method as set forth in claim 1 in which said conductive metal is gold.

7. The method as set forth in claim 1 in which said conductive metal is nickel.

8. The method as set forth in claim 1 in which said conductive metal is tin.

9. The method as set forth in claim 1 in which said conductive metal is bonded to one side of said laminate.

10. The method as set forth in claim 1 in which said conductive metal is bonded to both sides of said laminate.

11. The method as set forth in claim 1 in which said laminate is a glass epoxy resin.

12. The method as set forth in claim 1 in which said laminate is a glass polyimide resin.

13. The method as set forth in claim 1 in which said laminate is a paper epoxy resin.

14. The method as set forth in claim 1 in which said laminate is a paper phenolic resin.

15. A metal-clad laminate prepared by the method of claim 1.

16. A metal-clad laminate prepared by the method of claim 5.

17. A metal-clad laminate prepared by the method of claim 6.

18. A metal-clad laminate prepared by the method of claim 7.

19. A metal-clad laminate prepared by the method of claim 8.

20. A metal-clad laminate prepared by the method of claim 11.

21. A metal-clad laminate prepared by the method of claim 12.

22. A metal-clad laminate prepared by the method of claim 13.

23. A metal-clad laminate prepared by the method of claim 14.

24. A metal-clad laminate prepared by the method of claim 1 and in which said laminate comprises a thermosetting resin.

* * * * *